(12) United States Patent
Saito et al.

(10) Patent No.: US 6,201,465 B1
(45) Date of Patent: Mar. 13, 2001

(54) MAGNETORESISTIVE SENSOR AND ITS MANUFACTURING METHOD

(75) Inventors: Masamichi Saito; Toshinori Watanabe; Kiyoshi Sato; Toshihiro Kuriyama, all of Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/432,456

(22) Filed: Nov. 2, 1999

Related U.S. Application Data (63) Continuation of application No. 08/707,544, filed on Sep. 4, 1996.

(30) Foreign Application Priority Data

Sep. 5, 1995 (JP) .................................... 7-228077

(51) Int. Cl.$^7$ .................................................. H01L 43/00
(52) U.S. Cl. ...................................... 338/32 R; 360/324.1
(58) Field of Search ............................ 338/32 R; 360/113

(56) References Cited

U.S. PATENT DOCUMENTS

| | | | |
|---|---|---|---|
| 5,206,590 | * 4/1993 | Dieny et al. | 360/113 |
| 5,583,725 | * 12/1996 | Coffey et al. | 360/113 |

OTHER PUBLICATIONS

Carey et al., "Exchange anisotropy in coupled films of Ni[sub81]Fe[sub19] with NiO and Co[subx]Ni[sub 1–x]O" App.Phys.Lttr, V. 60, No. 24, pp. 3060–62, (Jun. 15, 1992).*

* cited by examiner

Primary Examiner—Karl D. Easthom
(74) Attorney, Agent, or Firm—Brinks Hofer Gilson & Lione (57) ABSTRACT

A magnetoresistive sensor is fabricated as follows. First of all, first antiferromagnetic layers are created on the upper surfaces on both sides of a lower-gap layer, sandwiching a track width on the upper surface of the lower-gap layer. Then, a free magnetic layer, a nonmagnetic electrically conductive layer, a pinned magnetic layer and a second antiferromagnetic layer are stacked on the first antiferromagnetic layers and a portion on the track width one after another in the order the layers are enumerated. Since the free magnetic layer is created after the first antiferromagnetic layer, the free magnetic layer and the first antiferromagnetic layer are adhered to each other with a high degree of reliability. When the direction of magnetization in the free magnetic layer is changed by an external magnetic field, the electrical resistance of the magnetoresistive sensor also changes. The change in electrical resistance is, in turn, used for detecting the external magnetic field. Since the first antiferromagnetic layers put the free magnetic layer in a single-domain state in the X direction, the amount of Barkhausen noise can be reduced.

17 Claims, 3 Drawing Sheets

MAGNETORESISTIVE SENSOR AND ITS MANUFACTURING METHOD

This application is a continuation of application Ser. No. 08/707,544, filed Sep. 4, 1996, which is a continued prosecution application of application Ser. No. 08/707,544 filed Sep. 4, 1996, (pending).

BACKGROUND OF THE INVENTION

1. Field of the Invention

In general, the present invention relates to a magnetoresistive sensor mounted on a magnetic recording/reproducing apparatus or another magnetic detecting apparatus. In particular, the present invention relates to a magnetoresistive sensor and its manufacturing method which magnetoresistive sensor is of the so-called spin-valve type wherein the electrical resistance thereof varies due to a change in relation between the direction of the magnetization of a pinned magnetic layer and the direction of magnetization of a free magnetic layer which is affected by an external magnetic field.

2. Description of the Related Art

Figure 3:
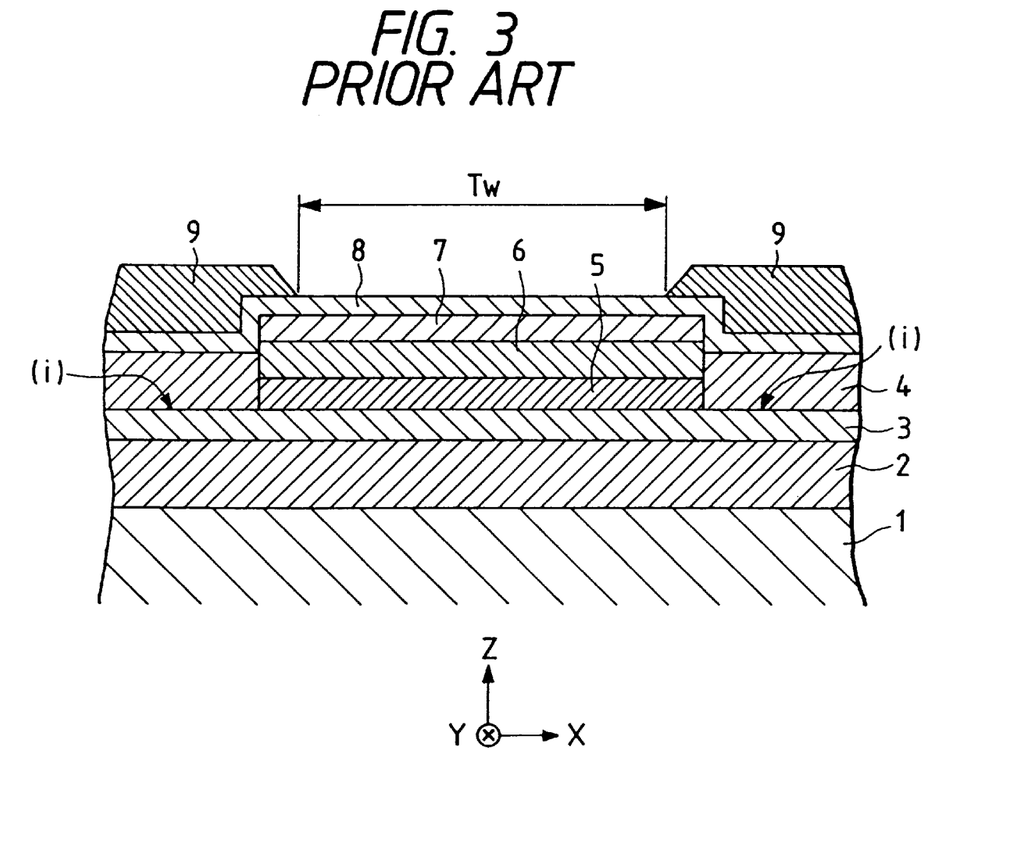
FIG. 3 is a diagram showing a front view of the conventional magnetoresistive sensor.

FIG. 3 is a diagram showing a front view of a magnetoresistive sensor based on the spin-valve effect disclosed in U.S. Pat. No. 5,206,590. The Z direction in the figure is the moving direction of a magnetic recording medium such as a rigid disk relative to the magnetoresistive sensor whereas the Y direction is the direction of a leaking magnetic field (an external magnetic field) from the magnetic recording medium.

In the magnetoresistive sensor shown in FIG. 3, a nonmagnetic underlayer 2 made of a nonmagnetic material such as Ta (tantalum) is created on a lower-gap layer 1 made of typically $Al_2O_3$ (aluminum oxide). A free magnetic layer 3 is created on the nonmagnetic underlayer 2. A nonmagnetic electrically conductive layer 5, a pinned magnetic layer 6 and a second antiferromagnetic layer 7 are stacked on the free magnetic layer 3 with a predetermined width in the X direction one after another in the order they are enumerated. At (i) portions on both edges of the nonmagnetic electrically conductive material 5 and the pinned magnetic material 6, first antiferromagnetic layers 4 are created on the free magnetic layer 3.

An upper layer 8 made of a nonmagnetic material such as Ta is created on the first antiferromagnetic layers 4 on both the sides and on the second antiferromagnetic layer 7 in the middle. Lead layers (electrically conductive layers) 9 are created on the upper layer 8, sandwiching an open track width Tw.

An exchange anisotropic coupling on a film boundary surface between the first antiferromagnetic layer 4 and the free magnetic layer 3 puts the free magnetic layer 3 into a single-domain state in the X direction, orientating the directions of magnetization in the X direction. On the other hand, an exchange anisotropic coupling on a film boundary surface between the second antiferromagnetic layer 7 and the pinned magnetic layer 6 puts the pinned magnetic layer 6 into a single-domain state in the Y direction, fixing the directions of magnetization in the Y direction (a direction perpendicular to the surface of the paper toward the reader).

In the magnetoresistive sensor based on the spin-valve effect, a steady-state current is supplied from the lead layer 9 to the free magnetic layer 3, the nonmagnetic electrically conductive layer 5 and the pinned magnetic layer 6 in the X direction. When a leaking magnetic field (an external magnetic field) from a magnetic recording medium such as a rigid disk is provided in the Y direction, the direction of magnetization of the free magnetic layer 3 changes from the X direction to the Y direction. The change in relation between the direction of magnetization in the free magnetic layer 3 and the pinned direction of magnetization of the pinned magnetic layer 6, which change is caused by a variation in magnetization direction in the free magnetic layer 3, changes the electrical resistance. The change in electrical resistance results in a change in voltage which is used for detecting the leaking magnetic field from the magnetic recording medium.

As described above, in the magnetoresistive sensor shown in FIG. 3, the exchange anisotropic couplings on the film boundary surface between the first antiferromagnetic layer 4 and the free magnetic layer 3 and on the film boundary surface between the second antiferromagnetic field 7 and the pinned magnetic layer 6 orientate the magnetic directions of the free magnetic layer 3 and the pinned magnetic layer 6 respectively in directions perpendicular to each other. As a result, the amount of Barkhausen noise can be reduced, giving rise to a merit that a linear response characteristic of the change in electrical resistance with respect to the leaking magnetic field from the magnetic recording medium can be guaranteed. On the top of that, since the dimension of the pinned magnetic layer 6 in the X direction is fixed, the off track performance with respect to the magnetic recording medium is also good.

In a process of manufacturing a magnetoresistive sensor with a structure shown in FIG. 3, however, after the nonmagnetic electrically conductive layer 5, the pinned magnetic layer 6 and the second antiferromagnetic layer 7 are stacked on the free magnetic layer 3 in a sputter process, it is necessary to remove the nonmagnetic electrically conductive layer 5, the pinned magnetic layer 6 and the second antiferromagnetic layer 7 from the (i) portions in an etching process such as ion milling. In addition, also required is a process for creating the first antiferromagnetic layer 4 on the (i) portions at both edges of the second antiferromagnetic layer 7, the pinned magnetic layer 6 and the nonmagnetic electrically conductive layer 5 each with a fixed dimension in the X direction.

The film thickness of each layer in the magnetoresistive sensor has a value ranging from several tens of Angstroms to several hundreds of Angstroms. The film thickness of the nonmagnetic electrically conductive layer 5 is about several tens of Angstroms. It is extremely difficult to remove the stacked structure comprising the three layers, that is, the nonmagnetic electrically conductive layer 5, the pinned magnetic layer 6 and the second antiferromagnetic layer 7, each having such a very small film thickness by means of ion milling with a high degree of accuracy. From the technological point of view, at the portion (i), it is also difficult to remove only the nonmagnetic electrically conductive layer 5 without removing the free magnetic layer 3 in order to expose the free magnetic layer 3. If a portion of the free magnetic layer 3 is inadvertently removed in this etching process, a bad effect on the magnetic characteristic of the free magnetic layer 3 will be resulted in. If the nonmagnetic electrically conductive layer 5 is inadvertently left at the portion (i) on the surface of the free magnetic layer 3, on the other hand, the first antiferromagnetic layer 4 created on the free magnetic layer 3 is not closely adhered to the free magnetic layer 3 because of the left nonmagnetic electrically conductive layer 5. As a result, no exchange anisotropic coupling is generated on the film boundary surface between the first antiferromagnetic layer 4 and the free magnetic layer 3.

SUMMARY OF THE INVENTION

The present invention addresses the problems of the conventional magnetoresistive sensor described above. It is thus an object of the present invention to provide a magnetoresistive sensor and its manufacturing method wherein an antiferromagnetic layer is brought directly in contact with a free magnetic layer in such a way that the former is closely adhered to the latter with a high degree of reliability and each layer of the magnetoresistive sensor can be created with ease.

The magnetoresistive sensor provided by the present invention comprises a free magnetic layer, a nonmagnetic electrically conductive layer, a pinned magnetic layer which are stacked from the bottom one after another in the order the layers are enumerated, an antiferromagnetic layer for orientating the directions of magnetization of the free magnetic layer by an exchange anisotropic coupling on the film boundary surface between the two layers and a pinning layer for pinning the directions of magnetization of the pinned magnetic layer in a direction crossing the direction of magnetization of the free magnetic layer, wherein the electrical resistance of the magnetoresistive sensor changes when the direction of magnetization of the free magnetic layer changes due to an external magnetic field. The magnetoresistive sensor is characterized in that the antiferromagnetic layer is placed beneath the free magnetic layer and, at portions on both sides sandwiching a predetermined track width, the antiferromagnetic layer and the free magnetic layer are closely adhered to each other.

It is possible to design the following configurations (a) and (b) in the magnetoresistive sensor provided by the present invention.

(a) Parts of portions on both sides of the lower-gap layer are removed in order to form a predetermined track width. The antiferromagnetic layers are then provided in the removed parts. Subsequently, the free magnetic layer is created on the upper surfaces of the antiferromagnetic layers on both sides and the upper surface of a portion on the formed track width between the antiferromagnetic layers.

(b) The antiferromagnetic layer is created on the entire upper surface of the lower-gap layer and a nonmagnetic underlayer having a dimension equal to a predetermined track width is then created on the antiferromagnetic layer. The free magnetic layer is then created on the upper surfaces of the antiferromagnetic layer and the nonmagnetic underlayer.

On the top of that, the antiferromagnetic layer which forms an exchange anisotropic coupling on the film boundary surface between the layer and the free magnetic layer is typically made of a material such as $\alpha$-$Fe_2O_3$ (iron oxide), NiO (nickel oxide), an Ni—Mn (nickel-manganese) alloy or a Pt—Mn (platinum-manganese) alloy.

A method of manufacturing the magnetoresistive sensor with the configuration (a) described above is characterized in that the method comprises: a process of removing parts of portions on both sides on the surface of the lower-gap layer to form a predetermined track width; a process of creating antiferromagnetic layers in the removed parts of the portions on both sides on the lower-gap layer; a process of stacking a free magnetic layer, a nonmagnetic electrically conductive layer and a pinned magnetic layer one after another in the order the layers are enumerated on the antiferromagnetic layers on both sides and a nonmagnetic underlayer on the lower-gap layer between the antiferromagnetic layers; and a process of creating a pinning layer for fixing the directions of magnetization of the pinned magnetic layer in a direction crossing the direction of magnetization of the free magnetic layer.

A method of manufacturing the magnetoresistive sensor with the configuration (b) described above is characterized in that the method comprises: a process of creating an antiferromagnetic layer on the entire surface of a lower-gap layer and a nonmagnetic underlayer on the antiferromagnetic layer; a process of removing the nonmagnetic underlayer to form a predetermined track width and exposing said antiferromagnetic layer on both sides; a process of stacking a free magnetic layer, a nonmagnetic electrically conductive layer and a pinned magnetic layer one after another in the order the layers are enumerated on the upper surface of the antiferromagnetic layers exposed on both the sides of the nonmagnetic layer and on the upper surface of the nonmagnetic layer; and a process of creating a pinning layer for pinning the directions of magnetization of the pinned magnetic layer in a direction crossing the direction of magnetization of the free magnetic layer.

In this present invention, unlike the conventional magnetoresistive sensor shown in FIG. 3, the antiferromagnetic layer for orientating the direction of magnetization of the free magnetic layer is created beneath the free magnetic layer. It is thus not necessary to remove both the edges of the nonmagnetic electrically conductive layer and the pinned magnetic layer created on the free magnetic layer, making the manufacturing of the magnetoresistive sensor provided by the present invention very simple. On the top of that, the free magnetic layer can be closely adhered to the antiferromagnetic layer, making it possible to orientate the direction of magnetization of the free magnetic layer with a high degree of reliability.

In addition, $\alpha$-$Fe_2O_3$, NiO, the Ni—Mn alloy or the Pt—Mn alloy used for making the antiferromagnetic layer is a corrosion-proof material. Accordingly, when the antiferromagnetic layer is created first and the free magnetic layer is then created on the antiferromagnetic material, since the surface of the antiferromagnetic layer is corrosion proof, the antiferromagnetic material and the free magnetic material created thereon can be closely adhered to each other. As a result, it is possible to display an exchange anisotropic coupling on the film boundary surface between the two layers.

By the same token, in the method of manufacturing the magnetoresistive sensor provided by the present invention, it is not necessary to etch the nonmagnetic electrically conductive layer, the pinned magnetic layer and the pinning layer for pinning the direction of magnetization of the pinned magnetic layer. As a result, the processes of manufacturing the layers become very simple.

DESCRIPTION OF THE PREFERRED EMBODIMENTS

Figure 1:
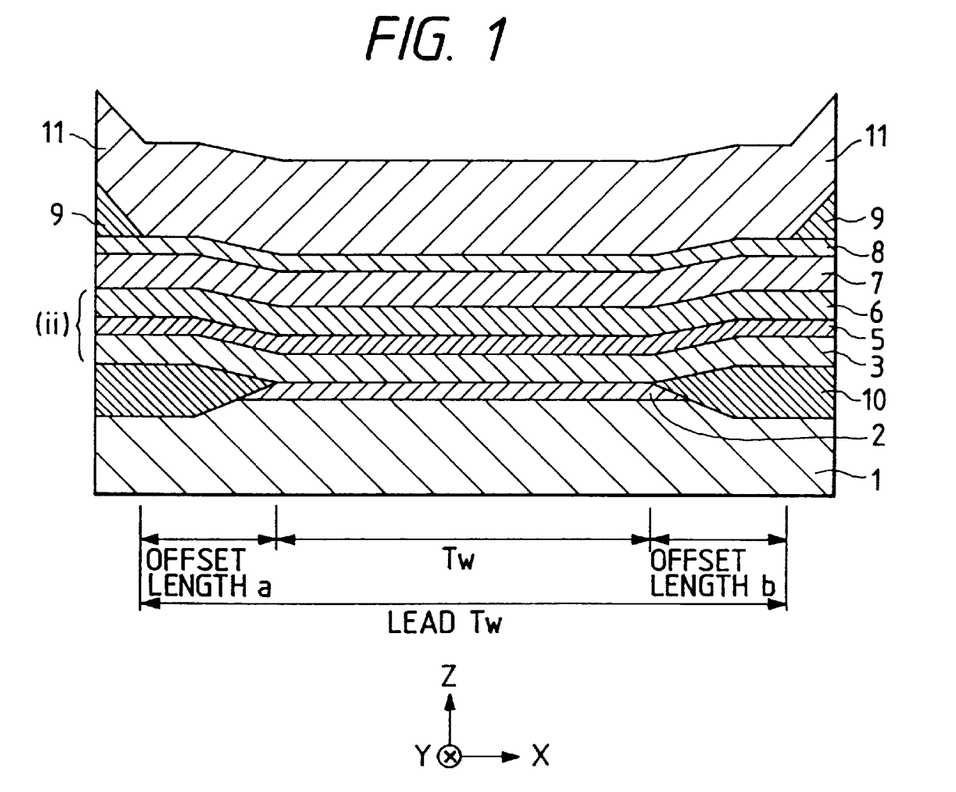
FIG. 1 is a diagram showing a front view of a magnetoresistive sensor provided by the present invention.
Figure 2:
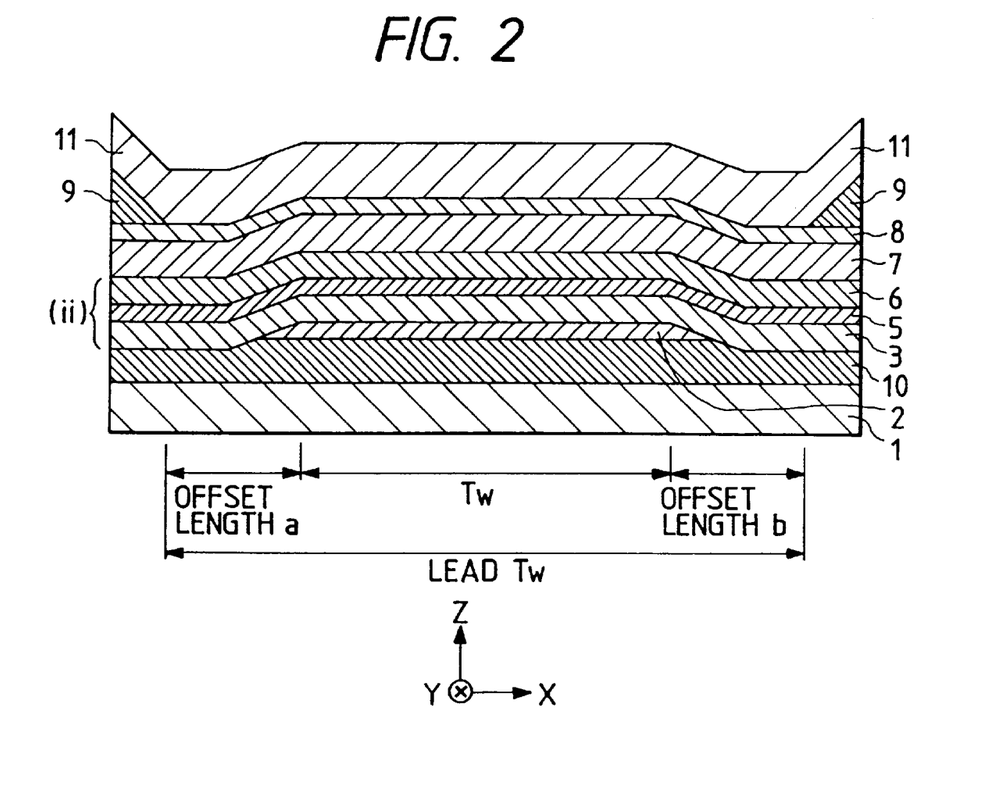
FIG. 2 is a diagram showing a front view of another magnetoresistive sensor provided by the present invention.

FIG. 1 is a diagram showing a front view of a magnetoresistive sensor provided by the present invention and FIG. 2 is a diagram showing a front view of a magnetoresistive sensor provided by the present invention with a structure different from that of the magnetoresistive sensor shown in FIG. 1. These magnetoresistive sensors are both based on the spin-valve effect.

In the magnetoresistive sensors shown in FIGS. 1 and 2, the Z direction is the movement direction of a magnetic recording medium and the Y direction is the direction of a leaking magnetic field (external magnetic field) from the magnetic recording medium.

First of all, the structure of the magnetoresistive sensor shown in FIG. 1 is explained. As shown in the figure, on both the edges of a lower-gap layer 1 of the magnetoresistive sensor which layer is made of $Al_2O_3$ (aluminum oxide), first antiferromagnetic layers 10 are created, sandwiching a predetermined track width Tw on the middle. Then, a free magnetic layer 3 is created on the upper surfaces of the first antiferromagnetic layers 10 on both sides and on the upper surface of the portion on the track width Tw of the lower-gap layer 1. The free magnetic layer 3 is made of an Ni—Fe (nickel-iron) alloy.

An exchange anisotropic coupling on the film boundary surface between the first antiferromagnetic layer 10 and the free magnetic layer 3 puts the free magnetic layer 3 into a single-domain state in the X direction, orientating the directions of magnetization of the free magnetic layer 3 in the X direction. For this reason, the first antiferromagnetic layer 10 is made of a material that an exhibits exchange anisotropic coupling with the free magnetic layer 3. In the case of the structure shown in FIG. 1, however, the first antiferromagnetic layer 10 is created first and the free magnetic layer 3 is created thereon. For this reason, it is necessary to make the first antiferromagnetic layer of a material, the surface of which is not prone to corrosion after the layer is created. This is because, if the surface of the first antiferromagnetic layer 10 corrodes, the close adherence between the first antiferromagnetic layer 10 and the free magnetic layer 3 deteriorates. It is therefore desirable to make the first antiferromagnetic layer 10 of one of $\alpha$-$Fe_2O_3$ (iron oxide), NiO (nickel oxide), an Ni—Mn (nickel-manganese) alloy or a Pt—Mn (platinum-manganese) alloy, a material which exhibits exchange an anisotropic coupling with the free magnetic layer 3 and is not prone to corrosion.

In addition, in the case of the first antiferromagnetic layer 10 made of $\alpha$-$Fe_2O_3$, not only the first antiferromagnetic layer 10 provides an exchange anisotropic magnetic field Hex to the free magnetic layer 3, but the coercive force Hc of the free magnetic layer 3 created on the first antiferromagnetic layer 10 can also be increased. As a result, the direction of the magnetization of the free magnetic layer 3 on the track width Tw can be stabilized, allowing the amount of Barkhausen noise to be reduced. On the top of that, at portions of offset lengths (a) and (b) on both the sides of the track width Tw, the exchange anisotropic magnetic field Hex provided to the free magnetic layer 3 by the first antiferromagnetic layers 10, which are made of $\alpha$-$Fe_2O_3$, increases, and in addition, the coercive force Hc of the free magnetic layer 3 at portions closely adhered to the first antiferromagnetic layers 10 also increases as well. As a result, at the portions of the offset lengths (a) and (b), the magnetization of the free magnetic layer 3 is fixed in the X direction. In this state, the direction of the magnetization of the free magnetic layer 3 is hardly affected by a leaking magnetic field from the magnetic recording medium, improving the off-track performance.

It should be noted that, at the portion of the track width Tw, the free magnetic layer 3 can be created directly above the lower-gap layer 1. It is desirable, none the less, to create a nonmagnetic underlayer 2 made of a nonmagnetic material such as Ta (tantalum) on the lower-gap layer 1 and then to create the free magnetic layer 3 on the nonmagnetic underlayer 2. The nonmagnetic underlayer 2 has a bcc structure (body-centered-cubic structure) and the free magnetic layer 3 is created on the nonmagnetic underlayer 2 to form crystal orientation, allowing a function for reducing the relative electrical resistance of the free magnetic layer 3 to be exhibited.

A nonmagnetic electrically conductive layer 5, a pinned magnetic layer 6 and a second antiferromagnetic layer 7 are then stacked on the free magnetic layer 3 one after another in the order the layers 5, 6 and 7 are enumerated. The nonmagnetic electrically conductive layer 5 is typically made of Cu (Copper). Much like the free magnetic layer 3, on the other hand, the pinned magnetic layer 6 is made of the Ni—Fe alloy. As for the second antiferromagnetic layer 7, the Pt—Mn (Platinum-manganese) alloy, an Fe—Mn (iron-manganese) alloy or the Ni—Mn (nickel-manganese) alloy can be use. An exchange anisotropic coupling on the film boundary surface between the second antiferromagnetic layer 7 and the pinned magnetic layer 6 puts the pinned magnetic layer 6 into a single-domain state in the Y direction, fixing the directions of magnetization in the Y direction (a direction perpendicular to the surface of the paper away from the reader).

An upper layer 8 which is typically made of Ta is created on the second antiferromagnetic layer 7. Lead layers (electrically conductive layers) 9 are created on the upper layer 8, sandwiching an open lead track width (Lead Tw). The lead layers 9 are each typically made of an electrically conductive material such as Cu, Ta or W (tungsten). An upper-gap layer 11 which is typically made of $Al_2O_3$ is then created above the upper layer 8 and the lead layers 9.

Next, another structure of the magnetoresistive sensor shown in FIG. 2 is explained.

In the case of the magnetoresistive sensor shown in FIG. 2, the first antiferromagnetic layer 10 is created over the entire upper surface of the lower-gap layer 1. The nonmagnetic underlayer 2, a nonmagnetic layer which is typically made of Ta, is created at the portion of the track width Tw on the first antiferromagnetic layer 10. Then, the free magnetic layer 3 is created on the upper surface of the first antiferromagnetic layer 10 and the nonmagnetic underlayer 2. Furthermore, the nonmagnetic electrically conductive layer 5, the pinned magnetic layer 6 and the second antiferromagnetic layer 7 are stacked on the free magnetic layer 3 one after another in the order the layers 5, 6 and 7 are enumerated.

Much like the magnetoresistive sensor shown in FIG. 1, in the magnetoresistive sensor shown in FIG. 2, the first antiferromagnetic layer 10 is made of $\alpha$-$Fe_2O_3$, NiO, the Ni—Mn alloy or the Pt—Mn alloy. The second antiferromagnetic layer 7 is made of the Pt—Mn alloy, the Fe—Mn alloy or the Ni—Mn alloy. The free magnetic layer 3 and the pinned magnetic layer 6 are, on the other hand, made of the Ni—Fe alloy. The nonmagnetic electrically conductive layer 5 is typically made of Cu.

The first antiferromagnetic layer 10 puts the free magnetic layer 3 in a single-domain state in the X direction, orientating the directions of magnetization of the free magnetic layer 3 in the X direction. On the other hand, an exchange anisotropic coupling on the film boundary surface between the second antiferromagnetic layer 7 and the pinned magnetic layer 6 puts the pinned magnetic layer 6 into a single-domain state in the Y direction, fixing the directions of magnetization in the Y direction (a direction perpendicular to the surface of the paper away from the reader).

The upper layer 8 which is typically made of Ta is created on the second antiferromagnetic layer 7. The lead layers 9 are created on the upper layer 8, sandwiching a lead track width (Lead Tw). The upper-gap layer 11 is then created above the upper layer 8 and the lead layers 9.

In both the magnetoresistive sensors shown in FIGS. 1 and 2, on both the sides of the track width Tw, the first antiferromagnetic layer 10 is closely adhered to the lower surface of the free magnetic layer 3. The directions of magnetization of the free magnetic layer 3 are orientated in the X direction by an exchange anisotropic magnetic field Hex of the first antiferromagnetic layer 10. On the other hand, the directions of magnetization of the pinned magnetic layer 6 are orientated by the second antiferromagnetic layer 7 in a direction perpendicular to the surface of the paper away from the reader. A steady-state current is supplied from the lead layer 9 to the free magnetic layer 3, the nonmagnetic electrically conductive layer 5 and the pinned magnetic layer 6 in the X direction. When a magnetic field from the magnetic recording medium is provided in the Y direction, the direction of magnetization of the free magnetic layer 3 changes from the X direction to the Y direction. The change in relation between the direction of magnetization in the free magnetic layer 3 and the direction of magnetization of the pinned magnetic layer 6 which change is caused by a variation in magnetization direction in the free magnetic layer 3 changes the electrical resistance of the magnetoresistive sensor. The change in electrical resistance results in a change in voltage for the steady-state current which voltage change is used for detecting the magnetic field from the magnetic recording medium.

In both the magnetoresistive sensors shown in FIGS. 1 and 2, the first and second antiferromagnetic layers 10 and 7 are provided at locations which are separated from each other so that the first and second antiferromagnetic layers 10 and 7 do not affect each other. As a result, it is easy to orientate the directions of magnetization of the free magnetic layer 3 and the pinned magnetic layer 6 in directions which are perpendicular to each other.

The magnetization of the pinned magnetic layer 6 is fixed in the Y direction by an exchange anisotropic coupling on the film boundary surface between the pinned magnetic layer 6 and the second antiferromagnetic layer 7 which is created over the entire surface of the pinned magnetic layer 6. In addition, in the case of the first antiferromagnetic layer 10 made of $\alpha\text{-Fe}_2\text{O}_3$, not only the first antiferromagnetic layer 10 provides an exchange anisotropic magnetic field Hex to the free magnetic layer 3 created thereon, but the coercive force Hc of portions of the free magnetic layer 3 closely adhered to the first antiferromagnetic layer 10 can also be increased. As a result, the direction of magnetization of the free magnetic layer 3 on portions other than the track width Tw in the X direction can be stabilized and since the magnetization of portions of the offset lengths (a) and (b) is hardly affected by the external magnetic field, the off-track performance is excellent.

On the top of that, the electrical resistance of the magnetoresistive sensor as a whole is determined by the lead track width (Lead Tw). As a result, by setting the gap between the lead layers 9 with a high degree of accuracy, variations in electrical resistance of the magnetoresistive sensor as a whole against a steady-state current become small.

Next, methods of manufacturing the magnetoresistive sensors shown in FIGS. 1 and 2 are explained.

Processes of manufacturing the magnetoresistive sensor shown in FIG. 1 are described as follows.

①The nonmagnetic underlayer 2 is created on the lower-gap layer 1 by means of a sputtering technique. Then, the upper surface of the nonmagnetic underlayer 2 is coated with a resist material prior to exposure and development processes. The resist layer is created only on the portion of the track width Tw. The track width Tw is set by this resist layer. Then, by means of an etching technique such as ion milling, the nonmagnetic underlayer 2 and part of the lower-gap layer 1 of areas where the resist layer are not created, that is, on both the sides of the track width Tw, are removed.

②With the resist layer created on the nonmagnetic underlayer 2, the first antiferromagnetic layers 10 are created by using a sputtering technique on the lower-gap layer 1 on both sides. Thereafter, the resist layer is removed by means of an etch-back method.

③The surfaces of the first antiferromagnetic layers 10 and the nonmagnetic underlayer 2 are cleaned by using a reverse sputtering technique. Then, the free magnetic layer 3, the nonmagnetic electrically conductive layer 5, the pinned magnetic layer 6, the second antiferromagnetic layer 7 and the upper layer 8 are created continuously one after another using a sputtering technique.

④A resist layer is created on the portion of the lead track width (Lead Tw) on the upper layer 8. With the resist layer put in its state as it is, the leads 9 are created. Then, the resist layer is removed. In this way, the leads layers 9 are created on the upper layer 8, sandwiching a gap, that is, the lead track width (Lead Tw). Thereafter, the upper-gap layer 11 is created on the upper surfaces of the upper layer 8 and the lead layers 9.

The magnetoresistive sensor shown in FIG. 1 can be manufactured through the processes described above. In these manufacturing processes, a resist layer is created on the nonmagnetic underlayer 2 in order to set the track width Tw. By means of ion milling, portions of the nonmagnetic underlayer 2 and part of the lower-gap layer 1 are removed and the first antiferromagnetic layers 10 are then created. Thereafter, layers from the free magnetic layer 3 to the upper layer 8 are merely created continuously one after another. In this way, the film making processes can be made simple. On the top of that, processes for the conventional magnetoresistive sensor shown in FIG. 3 to remove thin layers by means of an etching technique are not required any more.

In the processes of manufacturing the magnetoresistive sensor shown in FIG. 1, at a point of time after the upper layer 8 has been created, the lead track width (Lead Tw) is set by another resist layer. As alternative subsequent processes, on both the sides of the lead track width (Lead Tw), layers from the upper layer 8 to the free magnetic layer 3 or to portions of the surfaces of the first antiferromagnetic layers 10 are etched by means of ion milling and the lead layers 9 are then created on the antiferromagnetic layers 10 on both the sides of the lead track width (Lead Tw). In this case, even though the number of etching processes using the ion milling-technique increases, the depth accuracy of the etching processes using the ion-milling technique is not required because the first antiferromagnetic layers 10 and the free magnetic layer 3 are already closely adhered to each other. For example, even if some of the free magnetic layer 3 is left on the first antiferromagnetic layer 10 and the lead layer 9 is created thereon, there will be no functional problem arising.

Processes of manufacturing the magnetoresistive sensor shown in FIG. 2 are explained as follows.

① The first antiferromagnetic layer 10 is created over the entire surface of the lower-gap layer 1 using a sputtering technique. Subsequently, the nonmagnetic underlayer 2 is created on the first antiferromagnetic layer 10 also using a sputtering technique. Then, a resist layer for setting the track width Tw is created on the nonmagnetic underlayer 2. Subsequently, the nonmagnetic underlayer 2 and a portion of the antiferromagnetic layer in areas where the resist layer is not created are removed by an etching technique such as ion milling.

② Thereafter, layers from the free magnetic layer 3 to the upper layer 8 are continuously created one after another. By the same token, the lead layers 9 and the upper-gap layer 11 are created.

As described above, in the case of the method of manufacturing the magnetoresistive sensor shown in FIG. 1, the nonmagnetic underlayer 2 and the lower-gap layer 1 are removed by means of technique such as ion milling. The etching depth does not have an effect on the magnetoresistive sensor. Also in the case of the method of manufacturing the magnetoresistive sensor shown in FIG. 2, the functions of the magnetoresistive sensor are not affected even if an error is generated in the etching depth for the first antiferromagnetic layer 10. On the top of that, at the point of time the free magnetic layer 3 is created, the free magnetic layer 3 and the first antiferromagnetic layer 10 are closely adhered to each other with a high degree of reliability on both the sides of the track width Tw. As a result, the manufacturing methods become simple. In addition, the directions of magnetization in the free magnetic layer 3 of the magnetoresistive sensor after the manufacturing are orientated in one direction with a high degree of reliability and the amount of the Barkhausen noise is also reduced as well.

As described above, in both the magnetoresistive sensors shown in FIGS. 1 and 2, the second antiferromagnetic layer 7 is used for putting the pinned magnetic layer 6 in a single-domain state in the Y direction. It should be noted that, as an alternative, a magnetic material with a large coercive force Hc can be created on the pinned magnetic layer 6 and the permanent magnetization of the magnetic material is used for orientating the directions of magnetization in the pinned magnetic layer 6 in the Y direction.

According to the present invention, the antiferromagnetic layer for magnetizing the free magnetic layer in one direction is closely adhered to the lower surface of the free magnetic layer. In this way, the free magnetic layer and the antiferromagnetic layer are adhered to each other with a high degree of reliability, allowing the direction of magnetization of the free magnetic layer to be stabilized. In particular, in the case of an antiferromagnetic layer made of $\alpha$-$Fe_2O_3$, the magnetization of the free magnetization layer at portions other than the track width is stabilized, improving the off-track performance.

Unlike the conventional magnetoresistive sensor, the number of processes to etch layers can be reduced, making it possible to make the manufacturing processes simple. On the top of that, unlike the conventional magnetoresistive sensor, the state of adherence of the free magnetic layer and the antiferromagnetic layer is not affected by the etching accuracy and, at the time the free magnetic layer is created, the free magnetic layer and the antiferromagnetic layer can be adhered to each other with a high degree of reliability.

What is claimed is:

1. A magnetoresistive sensor comprising:

a lower-gap layer having an upper surface;

a first antiferromagnetic layer including first and second portions, each of the portions having an upper surface, wherein at least the upper surface of the first portion is separated along a first direction from the upper surface of the second portion, wherein at least the first and second portions are formed on the upper surface of the lower-gap layer;

a nonmagnetic underlayer operatively disposed adjacent to the lower-gap layer and the first antiferromagnetic layer along said first direction, the nonmagnetic underlayer separating at least the upper surfaces of the first and second portions of first antiferromagnetic layer, wherein the nonmagnetic underlayer defines a track width having first and second offset lengths adjacent thereto, wherein the track width and the first and second offset lengths define a lead track width;

a free magnetic layer including first and second sections closely adhered respectively to the upper surfaces of the first and second portions of the first antiferromagnetic layer, the free magnetic layer having a third section extending between the first and second sections, the third section formed on the nonmagnetic underlayer, wherein a direction of magnetization of the free magnetic layer is oriented through exchange anisotropic coupling with the first and second portions of the first antiferromagnetic layer;

a nonmagnetic electrically conductive layer formed on the free magnetic layer, a pinned magnetic layer formed on the nonmagnetic electrically conductive layer; and a second antiferromagnetic layer formed on the pinned magnetic layer for pinning a direction of magnetization of the pinned magnetic layer through exchange anisotropic coupling such that the pinned direction of magnetization crosses the oriented direction of magnetization of the free magnetic layer, wherein the electrical resistance of the magnetoresistive sensor varies when the oriented direction of magnetization of the free magnetic layer is changed by an external magnetic field, wherein the free magnetic layer is interposed between the nonmagnetic electrically conductive layer and the first antiferromagnetic layer, wherein the nonmagnetic electrically conductive layer is interposed between the free magnetic layer and the pinned magnetic layer, and wherein the pinned magnetic layer is interposed between the nonmagnetic electrically conductive layer and the second antiferromagnetic layer.

2. A magnetoresistive sensor according to claim 1 wherein the first antiferromagnetic layer comprises a material selected from the group consisting of $\alpha$-$Fe_2O_3$ (iron oxide), NiO (nickel oxide), Ni—Mn (nickel-manganese) alloy and Pt—Mn (platinum-manganese) alloy.

3. A magnetoresistive sensor according to claim 1, wherein the nonmagnetic underlayer is formed on the lower-gap layer.

4. A magnetoresistive sensor according to claim 1, wherein the nonmagnetic underlayer is formed on the first antiferromagnetic layer.

5. A magnetoresistive sensor according to claim 1, further comprising:

an upper layer formed on the second antiferromagnetic layer; and first and second lead layers formed on the upper layer, the lead layers defining the first and second offset lengths adjacent to the track width.

6. A magnetoresistive sensor comprising:

a lower gap layer having a track-width region intermediate to first and second offset regions, wherein the track-region and the first and second offset regions define a lead track width;

a first antiferromagnetic layer overlying at least the first and second offset regions of the lower gap layer;

a nonmagnetic underlayer defined by the track-width region and operatively disposed adjacent to the lower-gap layer and the first antiferromagnetic layer;

a free magnetic layer overlying the nonmagnetic underlayer and the first antiferromagnetic layer;

a nonmagnetic electrically conductive layer overlying the free magnetic layer;

a pinned magnetic layer overlying the nonmagnetic electrically conductive layer; and a second antiferromagnetic layer overlying the pinned magnetic layer, wherein the free magnetic layer is interposed between the nonmagnetic electrically conductive layer and the first antiferromagnetic layer, wherein the nonmagnetic electrically conductive layer is interposed between the free magnetic layer and the pinned magnetic layer, and wherein the pinned magnetic layer is interposed between the nonmagnetic electrically conductive layer and the second antiferromagnetic layer.

7. The magnetoresistive sensor of claim 6, wherein the first antiferromagnetic layer comprises a material selected from the group consisting of $\alpha$-$Fe_2O_3$ iron oxide), NiO (nickel oxide), NiMn (nickel-manganese) alloy, and PtMn (platinum-manganese) alloy.

8. The magnetoresistive sensor of claim 6, wherein the first antiferromagnetic layer comprises NiO (nickel oxide).

9. The magnetoresistive sensor of claim 7, wherein the second antiferromagnetic layer comprises a material selected from the group consisting of NiMn (nickel-manganese) alloy, FeMn (iron-manganese) alloy, and PtMn (platinum-manganese) alloy.

10. A magnetoresistive element according to claim 6, further comprising:

an upper layer overlying the second antiferromagnetic layer; and first and second lead layers overlaying the upper layer, the lead layers defining the first and second offset regions adjacent to the track-width region.

11. A magnetoresistive element comprising:

a first antiferromagnetic layer including first and second portions;

a second antiferromagnetic layer separated from the first antiferromagnetic layer by a nonmagnetic electrically conductive layer;

a nonmagnetic underlayer defining a track width adjacent to first and second offset lengths, wherein the track width and first and second offset lengths define a lead track width;

a free magnetic layer; and a pinned magnetic layer, wherein the second antiferromagnetic layer is in intimate contact with the pinned magnetic layer, wherein the nonmagnetic underlayer is operatively disposed between the first antiferromagnetic layer and the free magnetic layer, wherein the free magnetic layer is in intimate contact with at least first and second portions of the first antiferromagnetic layer and the nonmagnetic underlayer, wherein the free magnetic layer is interposed between the first antiferromagnetic layer and the nonmagnetic electrically conductive layer, wherein the nonmagnetic electrically conductive layer is interposed between the free magnetic layer and the pinned magnetic layer, wherein the pinned magnetic layer is interposed between the nonmagnetic electrically conductive layer and the second antiferromagnetic layer.

12. The magnetoresistive element of claim 11, wherein the first antiferromagnetic layer comprises a material selected from the group consisting of $\alpha$-$Fe_2O_3$ (iron oxide), NiO (nickel oxide), NiMn (nickel-manganese) alloy, and PtMn (platinum-manganese) alloy.

13. The magnetoresistive element of claim 12, wherein the first antiferromagnetic layer comprises NiO (nickel oxide).

14. The magnetoresistive element of claim 12, wherein the second antiferromagnetic layer comprises a material selected from the group consisting of NiMn (nickel-manganese) alloy, FeMn (iron-manganese) alloy, and PtMn (platinum-manganese) alloy.

15. A magnetoresistive element comprising:

a first antiferromagnetic layer including first and second portions;

a second antiferromagnetic layer separated from the first antiferromagnetic layer by a pinned magnetic layer, a nonmagnetic electrically conductive layer and a free magnetic layer, wherein the second antiferromagnetic layer is in contact with the pinned magnetic layer, wherein the free magnetic layer is in contact with at least first and second portions of the first antiferromagnetic layer, wherein the free magnetic layer is interposed between the first antiferromagnetic layer and the nonmagnetic electrically conductive layer, wherein the nonmagnetic electrically conductive layer is interposed between the free magnetic layer and the pinned magnetic layer, wherein the pinned magnetic layer is interposed between the nonmagnetic electrically conductive layer and the second antiferromagnetic layer, and wherein the first antiferromagnetic layer is disposed on a face away from the second antiferromagnetic layer of the free magnetic layer.

16. The magnetoresistive element according to claim 15, wherein the first antiferromagnetic layer comprises a material selected from the group consisting of $\alpha$-$Fe_2O_3$ (iron oxide), NiO (nickel oxide), a NiMn (nickel-maganese) alloy, and a PtMn (platinum-manganese) alloy.

17. The magnetoresistive element according to claim 16, wherein the second antiferromagnetic layer comprises a material selected from the group consisting of a NiMn (nickel-manganese) alloy, an FeMn (iron-manganese) alloy, and a PtMn (platinum-manganese) alloy.

* * * * *

UNITED STATES PATENT AND TRADEMARK OFFICE
CERTIFICATE OF CORRECTION

PATENT NO. : 6,201,465 B1
DATED : March 13, 2001
INVENTOR(S) : Masamichi Saito et al.

It is certified that error appears in the above-identified patent and that said Letters Patent is hereby corrected as shown below:

Title page,
Item [57], lines 1-2, under "ABSTRACT", change "is fabricated as follows. First of all, first antiferromagnetic layers are created on" to -- fabricated by creating first antiferromagnetic layers on --.
Line 3, under "ABSTRACT", change "surfaces on both sides of a lower-gap layer, sandwiching a" to -- surfaces of a lower-gap layer, the antiferromagnetic layer having first and second exposed portions separated by a --.
Line 4, under "ABSTRACT", delete "on".
Line 9, under "ABSTRACT", change "another in the order the layers are enumerated. Since" to -- another. Since --.

Claim 7,
Line 3, change "of α– $Fe_2O_3$ iron oxide)," to -- of α– $Fe_2O_3$ (iron oxide), --.

Signed and Sealed this

Twelfth Day of February, 2002

Attest:

Attesting Officer

JAMES E. ROGAN
Director of the United States Patent and Trademark Office